United States Patent [19]
Pawlowski et al.

[11] Patent Number: 6,038,199
[45] Date of Patent: Mar. 14, 2000

[54] PORTABLE DIGITAL AUDIO RECORDER WITH ADAPTIVE CONTROL CONFIGURATIONS

[75] Inventors: John J. Pawlowski, Shelton; Stephen Rothschild, Ridgefield; David K. Godin, Wilton; Richard S. Colon; John J. Dwyer, both of Stratford, all of Conn.

[73] Assignee: Dictaphone Corporation, Stratford, Conn.

[21] Appl. No.: 09/190,198

[22] Filed: Nov. 12, 1998

Related U.S. Application Data

[60] Provisional application No. 60/066,748, Nov. 21, 1997.

[51] Int. Cl.[7] .................................................. G11B 19/00
[52] U.S. Cl. ........................................................... 369/25
[58] Field of Search ................................. 369/25, 7, 26, 369/27, 28, 29; 379/67.1, 68, 75

[56] References Cited

U.S. PATENT DOCUMENTS

| | | | |
|---|---|---|---|
| 5,146,439 | 9/1992 | Jachmann et al. | 369/25 |
| 5,265,075 | 11/1993 | Bergeron et al. | 369/25 |
| 5,477,511 | 12/1995 | Englehardt | 369/25 |
| 5,481,645 | 1/1996 | Bertino et al. | 704/270 |
| 5,903,871 | 5/1999 | Terui et al. | 704/500 |

OTHER PUBLICATIONS

Lisa Joy Stifelman, "VoiceNotes: An Application for a Voice–Controlled Hand–Held Computer", Jun. 1992.

*Primary Examiner*—Tan Dinh
*Attorney, Agent, or Firm*—Whitman Breed Abbott & Morgan LLP; Nathaniel Levin

[57] ABSTRACT

A portable digital audio recorder provides a first set of control or editing options with respect to a first category of voice data files stored in the recorder, and provides a different set of control or editing options with respect to a second category of voice data files stored in the recorder. The recorder may also be conveniently shared among a number of users and adapts various operating parameters to the preferences of the current user.

19 Claims, 7 Drawing Sheets

DIGITAL PORTABLE RECORDER (BLOCK DIAGRAM)

DIGITAL PORTABLE RECORDER (BLOCK DIAGRAM)

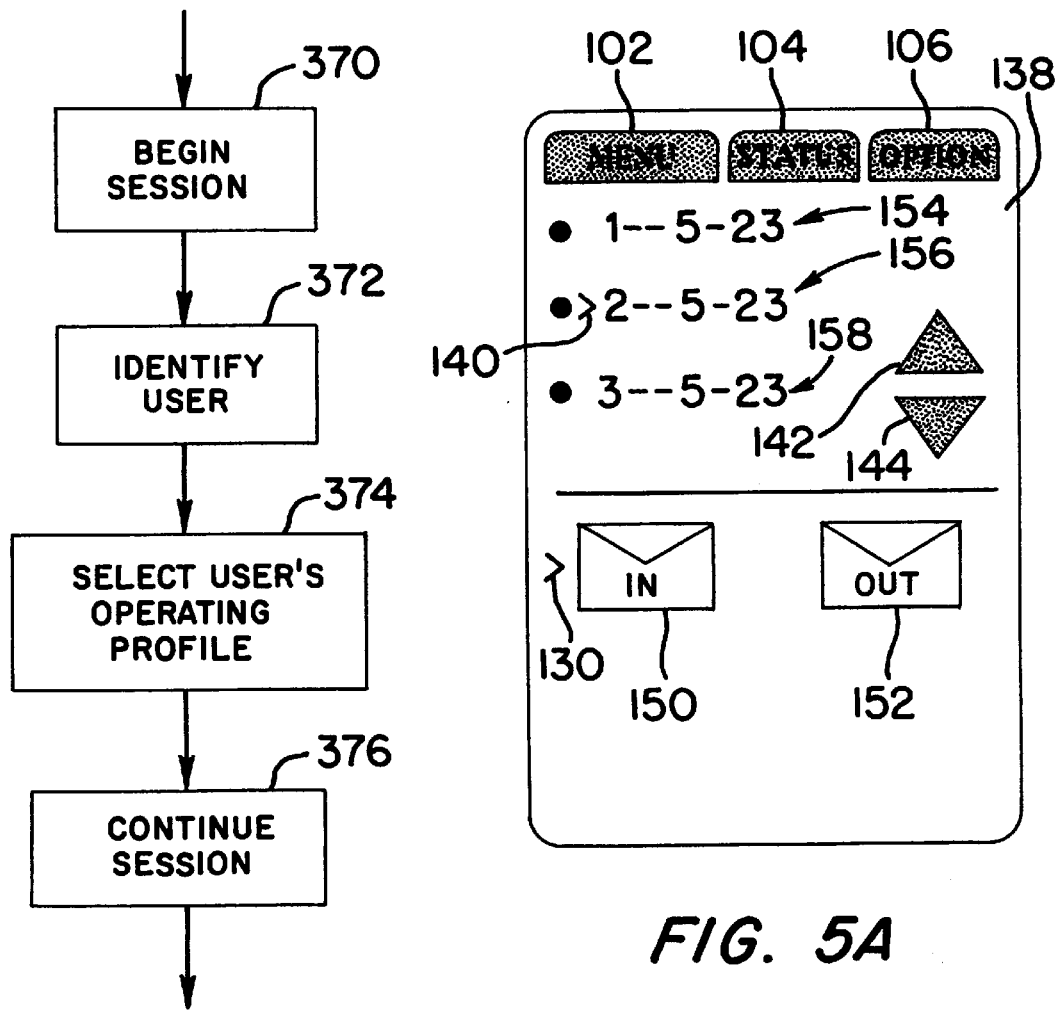

SETTING CONTROL OPTIONS

PORTABLE DIGITAL AUDIO RECORDER WITH ADAPTIVE CONTROL CONFIGURATIONS

CROSS-REFERENCE TO RELATED APPLICATION

This is a continuation-in-part of provisional patent application Ser. No. 60/066,748, filed Nov. 21, 1997.

BACKGROUND OF THE INVENTION

Pocket-sized voice recorders are widely used as a convenient way to take notes, store information and create documents in audio form. Among other applications, the recorded information may be transcribed to present the information in written form.

In recent years, compact audio recorders have been proposed in which the audio information is stored as digital data in a solid state memory. In some cases, a removable memory card is used as the storage medium.

Portable digital audio recorders that are currently available in the market suffer from significant limitations in terms of flexibility and ease of use. Among other issues that have not been satisfactorily addressed by the prior art are how a portable digital audio recorder may best be used for storing and replaying voice mail messages, and how to facilitate sharing a single recorder unit among two or more users.

OBJECTS AND SUMMARY OF THE INVENTION

It is an object of the invention to provide a portable digital audio recorder that functions satisfactorily with respect to voice data files which originate in the recorder itself, and voice mail messages downloaded to and stored in the recorder.

It is a further object of the invention to facilitate sharing a single portable digital audio recorder unit among two or more users.

According to an aspect of the invention, there is provided a portable digital audio recorder which includes a microphone for converting voice sounds spoken by a user of the recorder into analog electrical signals, circuitry for converting the analog electrical signals into digital voice signals, a recording medium for storing the digital voice signals in the form of a plurality of voice data files, with at least one of the voice data files being of a first type and at least one of the voice data files being of a second type different from the first type, a mechanism for selecting one of the stored voice data files, circuitry for determining the type of the selected voice data file, and a control circuit which provides a first set of control options with respect to the selected voice data file if the selected voice data file is of the first type and provides a second set of control options with respect to the selected voice data file if the selected voice data file is of the second type, the second set of control options being different from the first set of control options. For example, voice data files which originated in the recorder may be subject to a complete set of editing options, whereas voice mail messages downloaded to and stored in the recorder may be subjected to a limited set of control options, or editing of the downloaded voice mail messages may be inhibited entirely. It is also contemplated that voice data files originating in the recorder may be segregated into different types, including a first type for which a complete set of editing options is available, and a second type for which limited options are available or editing is inhibited.

By adapting the control options available to the user according to the type of voice data file accessed by the user, the portable digital audio recorder provided according to this aspect of the invention is optimized for use with a variety of different types of voice data files. Moreover, management of the various types of voice data files is enhanced.

According to another aspect of the invention, there is provided a portable digital audio recorder which includes a microphone for converting voice sounds spoken by a user of the recorder into analog electrical signals, circuitry for converting the analog electrical signals into digital voice signals, a recording medium for storing the digital voice signals, circuitry for generating identification data which identifies the user of the recorder, and circuitry for setting operating parameters for the recorder on the basis of the identification data. According to a preferred method of operating the recorder, a plurality of sets of operating parameters for the recorder are stored, identification data which identifies a current user of the recorder is generated, one of the stored sets of operating parameters is selected on the basis of the identification data, and the recorder is then operated in accordance with the selected set of operating parameters.

This aspect of the invention allows a user's preferred set of operating parameters to be pre-stored and then brought into use when the user is identified as the person who is currently using the recorder. In this way, sharing of the recorder among two or more users is facilitated. Among the parameters that may be pre-set to the user's preference are sound output volume, playback rate, rewind increment, VOX (voice operated recording) set to on or off, VOX sensitivity, timing of end zone warning, compression algorithm, microphone gain level, etc.

BRIEF DESCRIPTION OF THE DRAWINGS

FIG. 5A is a display provided by the recorder of FIGS. 2 and 3 when operated in a "voice mail" mode.

FIG. 9 is a flow chart which illustrates a software routine for selecting an operating parameter profile for the portable recorder in accordance with an aspect of the invention.

DESCRIPTION OF PREFERRED EMBODIMENTS

Figure 1:
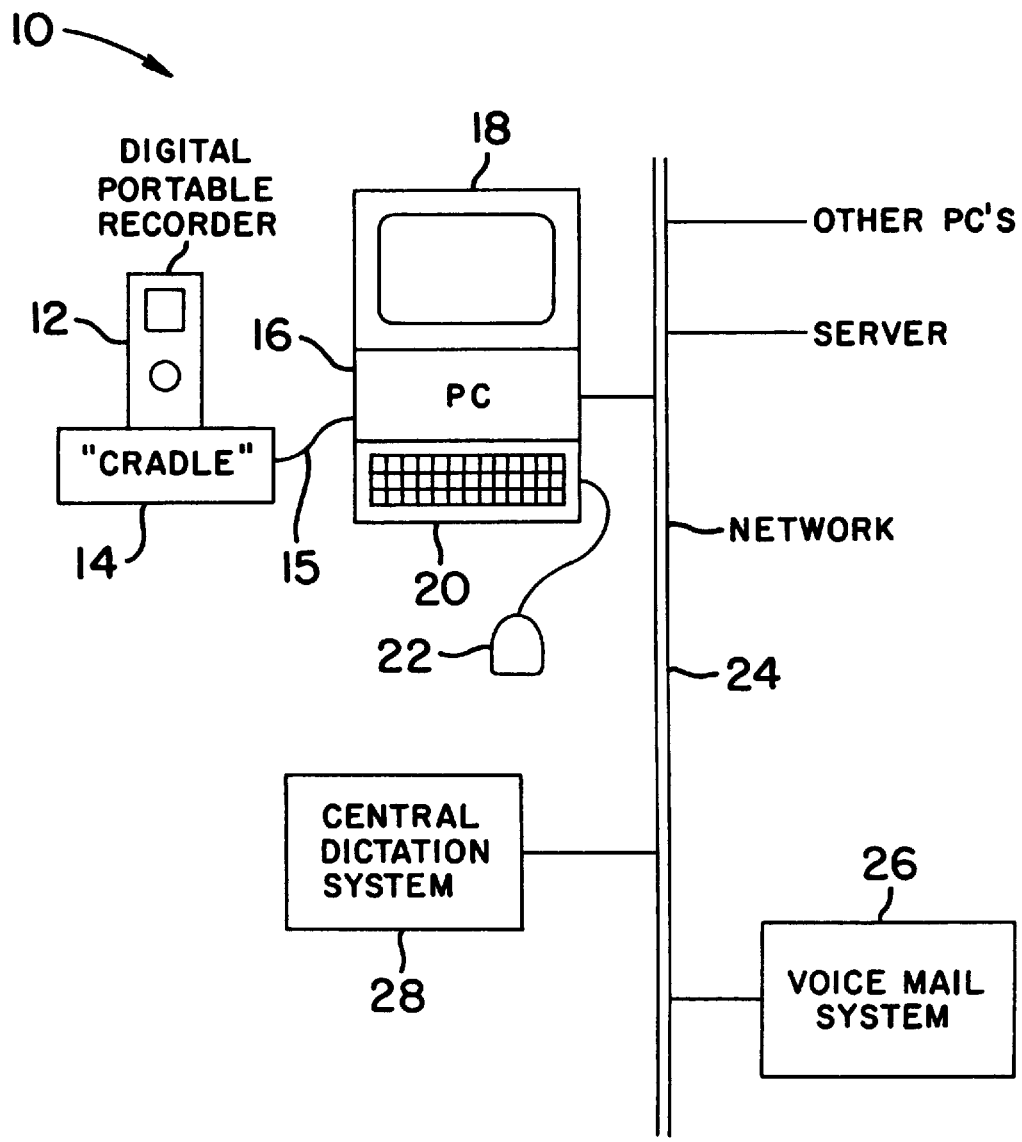
FIG. 1 is a block diagram of a voice data management system which includes a portable digital audio recorder provided in accordance with the present invention.

An embodiment of the invention will now be described, initially with reference to FIG. 1. In FIG. 1, reference numeral 10 generally indicates a voice data management system which includes a portable digital voice recorder 12 provided in accordance with the invention. The recorder 12 is shown resting on a docking station or "cradle" 14. A cable 15 connects the cradle 14 to a personal computer 16. The cradle forms part of a signal path which permits exchanging of digital data between the portable recorder 12 and the PC 16.

The PC 16 is preferably of conventional construction, including a display 18, keyboard 20 and mouse 22. Among other functions, the PC 16 receives and stores voice data files transferred to the PC 16 from the recorder 12. Details of suitable software for controlling the PC 16 in connection with its interactions with the recorder 12 are set forth in co-pending patent application Ser. No. 09/190,196 (Attorney Docket No. B653-021), entitled "VOICE FILE MANAGEMENT IN PORTABLE DIGITAL AUDIO RECORDER", which has common inventors and a common assignee with the present application.

Also shown in FIG. 1 is a local area network (LAN) 24 which provides for data communication among the PC 16 and other system components, including other personal computers, a network server device, a voice mail system 26 and a central dictation system 28. Like the LAN 24, the other system components just enumerated may all be conventional items. As will be seen, the PC 16 is preferably operable to download to the recorder 12 voice mail messages transferred to the PC 16 from the voice mail system 26 via LAN 24. The PC also preferably operates to transfer to the voice mail system 26 voice mail messages created in the recorder 12 and uploaded from the recorder 12 to the PC 16.

Overview Of Portable Recorder Hardware

Figure 2:
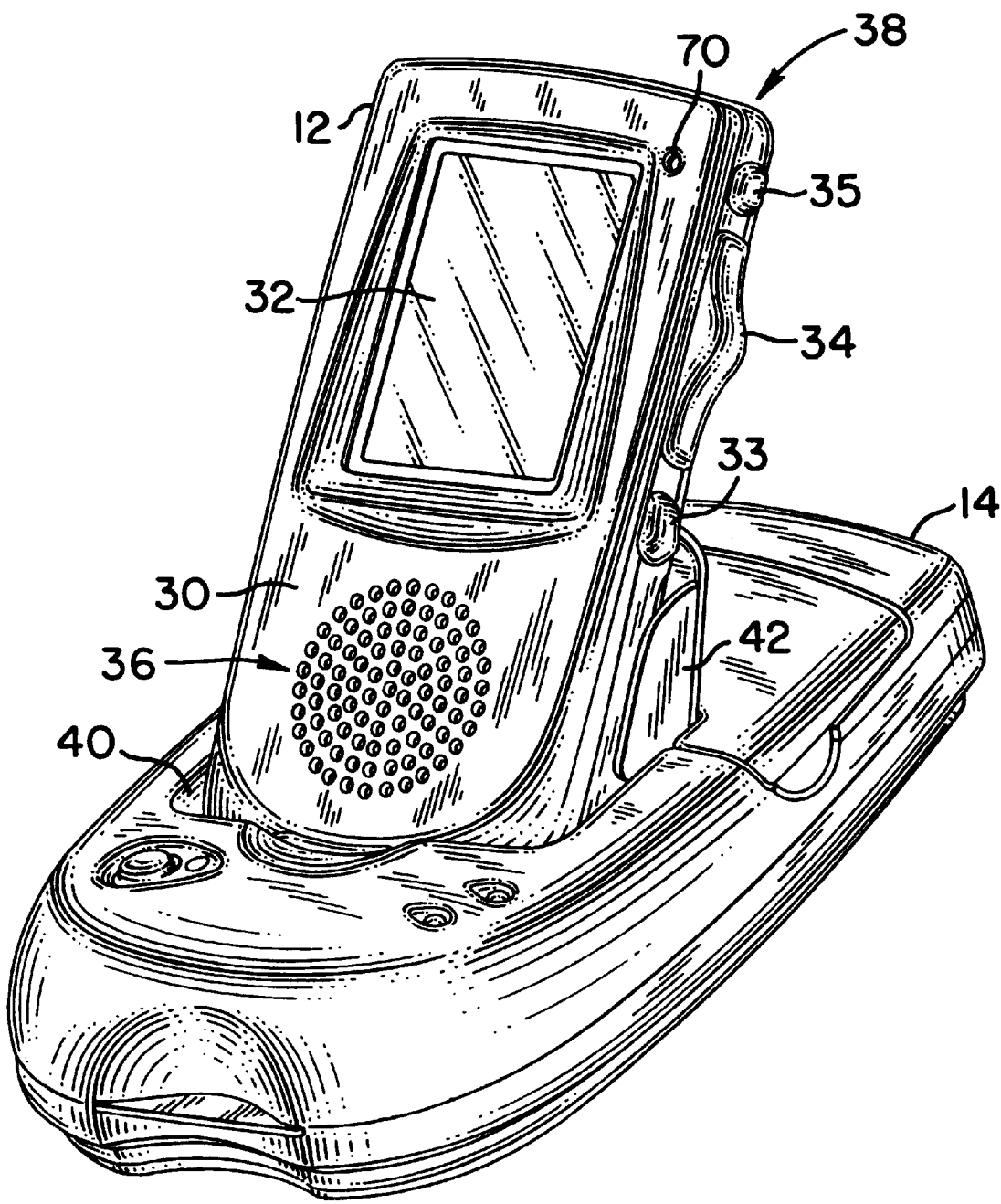
FIG. 2 is a perspective view of a portable digital voice recorder and a docking station which are part of the system of FIG. 1.

FIG. 2 is a perspective view showing some details of the portable recorder 12 and cradle 14. As seen in FIG. 2, the portable recorder 12 includes a housing 30, on which are mounted a display screen 32 and a slide switch 34. The recorder 12 may be like recorders disclosed in co-pending application Ser. No. 09/177,028, filed Oct. 22, 1998. The recorder 12 is preferably a very compact item, such that the housing 30 is shaped and sized to fit in the user's hand. The display screen 32 is preferably a touch screen which allows the user to interact with the recorder 12 in a manner similar to that employed in so-called "personal digital assistants". A stylus (not shown) may be provided with the recorder to aid in inputting user selections via the touch screen.

The slide switch 34 is used to control conventional functions provided in a portable voice recorder, such as "record", "play", "rewind", and "stop". The functioning of the slide switch preferably emulates the user interface provided by high-end tape-based dictation units, so that users familiar with conventional dictation practices can easily adapt to using the digital recorder described herein. Push buttons 33, 35 may provide additional functions, such as "fast forward" or "cue". Alternatively, one of the buttons may control backlighting for the screen 32.

Other salient features of the recorder 12 include a grille region 36 in the housing, provided to cover a speaker which is built into the recorder. The recorder 12 also includes a microphone which is not shown in FIG. 2, but is preferably installed at a corner 38 of the housing near the slide switch 34.

The recorder 12 rests in a recess 40 of the cradle 14 and reclines against a lid 42 for the recess 40. Provided within the recess 40 of the cradle 14, and not visible in FIG. 2, is a parallel data connection which mates with a corresponding connection in the base of the recorder housing 30. The recorder parallel connection also is not visible in the drawing.

Figure 3:
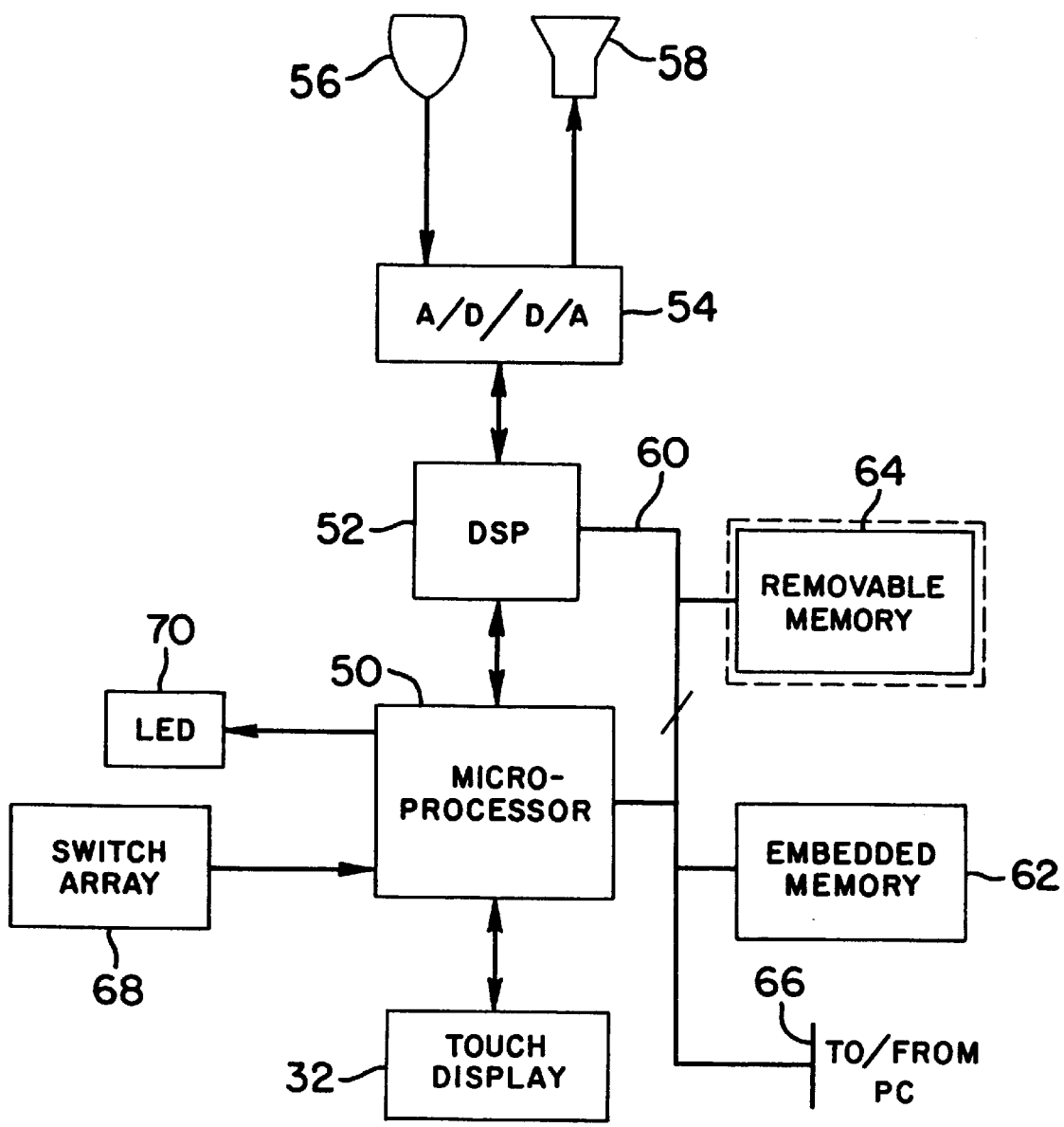
FIG. 3 is a block diagram representation of electrical and electronic components of the portable recorder of FIG. 2.

Electric and electronic components of the recorder 12 are illustrated in block diagram form in FIG. 3. It is to be understood that the components shown in FIG. 3 are mounted within or on the recorder housing 30 (FIG. 2).

Continuing to refer to FIG. 3, a microprocessor or microcontroller 50 is mounted within the recorder and controls operations of the recorder. The microprocessor 50 is connected to a digital signal processing circuit 52 and exchanges command and data messages with the DSP 52. The DSP 52 is, in turn, connected to a circuit 54 which performs analog-to-digital and digital-to-analog signal conversion functions. The recorder also has a built-in microphone 56 and speaker 58 which are connected to the A/D and D/A circuit 54. (To simplify the drawing, signal conditioning circuits such as filters and amplifiers are not shown.) A multi-bit signal bus 60 interconnects the microprocessor 50 with the DSP 52 as well as an embedded memory device 62, a removable memory card 64, and the above-mentioned parallel data port 66 by which data may be exchanged with the personal computer. The removable memory card 64 may be used primarily for storing voice files and associated header data (to be described below), and the embedded memory 62 may be used primarily for program and working memory. However, these roles may be shared or reversed.

The microprocessor 50 is also interconnected with the above-mentioned touch screen 32, by which the microprocessor 50 provides information to the user of the recorder, and through which the user inputs information to the microprocessor 50. Also providing input to the microprocessor 50 is a switch array 68 which is actuatable by the user by means of the above-mentioned slide switch 34 (FIG. 2). Illustrated in both FIGS. 2 and 3 is a light emitting diode 70 which is selectively illuminated by the microprocessor 50 to indicate when voice recording is taking place.

Overview of Portable Recorder Operating Modes

Figure 4:
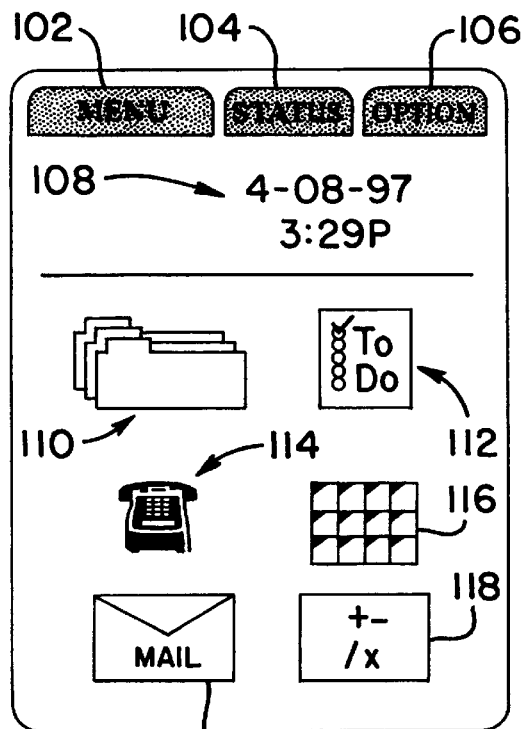
FIG. 4 is a main menu screen display provided by the recorder of FIGS. 2 and 3.

According to a preferred embodiment of the invention, the portable recorder incorporates features and functions found in known personal digital assistant devices, in addition to voice recording and playback and voice file management capabilities as described herein. FIG. 4 shows a "main menu" screen display which is provided to permit the user to select among the main operating modes of the recorder 12. The screen display of FIG. 4 includes tabs 102, 104 and 106. Preferably the three tabs 102, 104 and 106 are present in every display screen provided during operation of the recorder 12. The purpose of the tab 102 is to permit the user to access the "main menu" display, i.e. the display shown in FIG. 4. Tab 104 allows the user to access a "status" screen display (not shown in the drawings) which provides the user with information related to the status of the recorder 12, such as unused recording capacity, battery level, default volume level setting, and the quantity of stored items in a number of categories such as voice files, addresses, appointments, to-do items.

The functions accessible through tab 106 vary according to the current operating mode of the recorder 12. When the main menu display of FIG. 4 is present, or when the recorder is in the above-mentioned status mode, actuating the option tab 106 actuates a "configuration" operating mode in which the user is permitted to change a number of operating parameters for the recorder 12. The recorder operating parameters that can be set by the user will be discussed in more detail below.

Continuing to refer to FIG. 4, it will noted that the current date and time are displayed as shown at 108. In the lower portion of the display of FIG. 4, six icons are shown. Icon 110 provides access to a "folder" mode, in which a user is permitted to create, navigate among, and playback voice data files that are stored in the recorder 12. The "folder" mode will be discussed further below.

Icon 112 allows the user to access a "to-do" list. Icon 114 permits the user to access an address book/telephone number list function. Icon 116 permits the user to access an appointment calendar function, and icon 118 allows the user to place the recorder in an operating mode in which it emulates a calculator, with an appropriate display on the touch screen to represent the keys and digital readout provided in a typical hand-held calculator.

Icon 120 allows the user to access a "voice mail" function provided in recorder 12. As will be discussed below, in the voice mail operating mode, the user may access and playback voice mail messages downloaded for storage in the recorder 12 or the user may generate voice mail messages to be uploaded from the recorder 12 to the PC 16 (FIG. 1).

Figure 5:
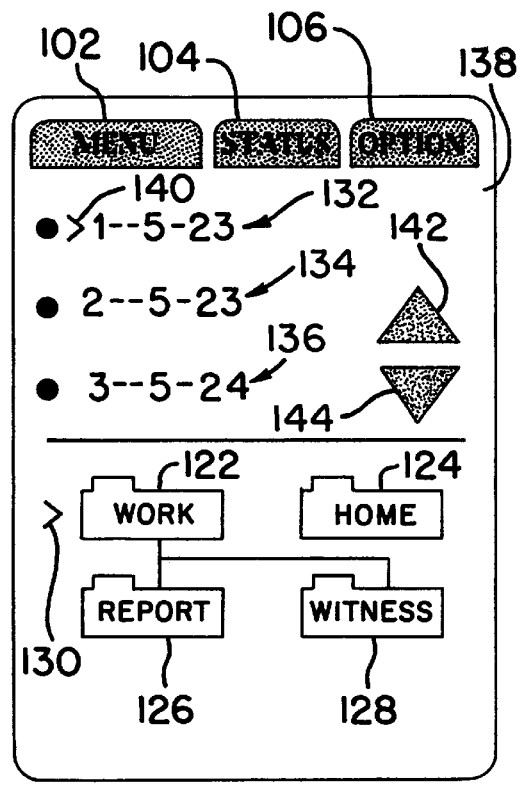
FIG. 5 is a display provided by the recorder of FIGS. 2 and 3 when operated in a "folder" mode.

FIG. 5 is a screen display provided by the recorder 12 when in the "folder" mode of operation (i.e. the mode accessed via icon 110 shown in FIG. 4). It will be noted that the screen display of FIG. 5 includes the same tabs 102, 104 and 106 as the display of FIG. 4. The tab 102 allows the user to return to the above-described main menu screen display of FIG. 4. The status tab 104 allows the user to enter the above-described status mode of operation. The functions of the option tab 106 in connection with the folder mode represented by the display of FIG. 5 will be described below.

It will be noted that the display of FIG. 5 includes folder icons 122, 124, 126 and 128. These icons are used to implement the well-known folder/file metaphor that is employed in the personal computer graphical user interfaces provided by the Macintosh and Windows operating systems. Accordingly, selecting one of the folder icons permits the user to access one or more "files" that have previously been "stored" in the selected folder. In particular, each of the stored files corresponds to a file of voice data that has been either generated by recording the user's voice via the microphone 56 for storage in the memory 64 (or 62), or a voice data file that has been downloaded from a separate device such as PC 16 for storage in the recorder 12. A pointer mark 130 adjacent to folder 122 indicates that folder 122 has been selected by the user. Consequently, voice files that had been associated with ("stored in") the folder 122 are made available for access by the user. Some of the files "stored" in the folder 122 are represented by entries 132, 134, 136 in an upper portion 138 of the display screen. Pointer mark 140 adjacent entry 132 indicates that the voice file represented by entry 132 has been selected for access by the user. The selected voice file may be played back or edited by the user by means of the control switches shown in FIG. 2 or via a screen-based user interface, which is not shown.

Arrow marks 142 and 144 may be actuated by the user to scroll in respective directions through the voice files stored in the selected folder.

According to a preferred implementation of the invention, each folder may have associated therewith or "stored therein" up to two sub-folders in addition to a number of voice files. According to the preferred implementation, the two highest level folders (respectively represented by icon 122—"work" and icon 124—"home") are always displayed. In addition, if one of the two top folders is selected (in the case of FIG. 5, icon 122) then the associated sub-folders (in this case represented by icons 126 and 128) are also displayed. If one of the sub-folders were to be selected then its respective sub-folders, if any, would also be displayed. A preferred implementation of the invention includes a three-level hierarchy of folders, but other arrangements are possible. Alternatively, it is contemplated that the hierarchical folder implementation could be replaced with an ordered and scrollable stack of folders.

Referring once more to the option tab 106, actuation of this tab permits the user to access a number of functions relating to the folder and file storage system. For example, the user may be permitted to delete a selected file, move a selected file from one folder to another, play all files in a selected folder, or edit the name of a file or folder. For the latter function, an alphanumeric keypad (not shown) is displayed.

It should be understood that the information displayed in FIG. 5 may be representative of data including folder and file associations, stored in the embedded memory 62 (FIG. 3) of the recorder 12. Meanwhile, some or all of the voice file data itself is preferably stored in the removable memory 64.

FIG. 5A is a screen display provided by the recorder 12 when in the "voice mail" mode of operation (i.e. the mode accessed via icon 120 shown in FIG. 4). It will noted that the screen display of FIG. 5A includes the same tabs 102, 104 and 106 as shown in FIGS. 4 and 5. The tabs 102 and 104 have the same functions as discussed above in connection with FIG. 5. The functions of the option tab 106 in connection with the voice mail mode represented by the display of FIG. 5A will be described below.

"Envelope" icons 150 and 152 are included in the display of FIG. 5A. Icon 150 can be selected to permit access to voice data files representing voice mail messages downloaded to the recorder unit from the PC 16. Icon 152 permits the user to access a function for creating voice mail messages to be uploaded to the PC 16 for transmission to intended recipients of the voice mail messages. Selecting icon 152 also provides access to previously recorded outgoing voice mail messages (either to be uploaded or already having been uploaded).

Pointer mark 130 shown in FIG. 5A indicates that the "incoming mail" envelope 150 has been selected. Consequently, entries 154, 156, 158, respectively representing incoming voice mail messages downloaded to the recorder unit, are displayed in the upper portion 138 of the display of FIG. 5A. Pointer mark 140 in FIG. 5A indicates that the user has accessed the voice mail message represented by entry 156.

As in FIG. 5, arrow marks 142 and 144 are provided to permit the user to scroll through the voice mail messages stored in association with a selected envelope icon.

When a voice mail message file has been accessed, the user is permitted to playback the file. Full editing options are available with respect to outgoing voice mail message files, but with respect to incoming voice mail message files that have been downloaded to the recorder, as will be discussed below, either limited editing options are available or, according to an alternative embodiment, no editing at all is permitted.

If the option tab 106 is actuated at a time when one of the envelope icons 150, 152 has been selected, then the user is presented the option of playing all the files associated with the selected icon.

When one of the voice data files has been selected, actuating the option tab 106 provides the user with the following options: play all files, delete a file, and move a file to a new folder. It will be understood that the envelope icons 150 and 152 may be accorded essentially the same functions as the "folders" described above in connection with FIG. 5. Accordingly, it is contemplated to "move" voice mail message files from the "in" envelope to the "out" envelope. It is also contemplated to "move" voice mail message files from the "in" envelope 150 or the "out" envelope 152 to one of the folders referred to in connection with FIG. 5, or to move files from one of the folders to the "out" envelope, in which case the subject voice data file may be transferred to the PC 16 as an outgoing voice mail message.

When the outgoing voice mail message function is accessed through the envelope icon 152, the user is permitted to generate and edit a voice data file, and then to associate with the voice data file addressing information for routing the voice mail message to the desired recipient. The addressing information may be entered via the touch screen, or selected from previously entered data included in the address book/telephone list database resident in the recorder unit, or derived from an incoming voice mail message pursuant to a "reply-to-sender" function which is described below.

Figure 6:
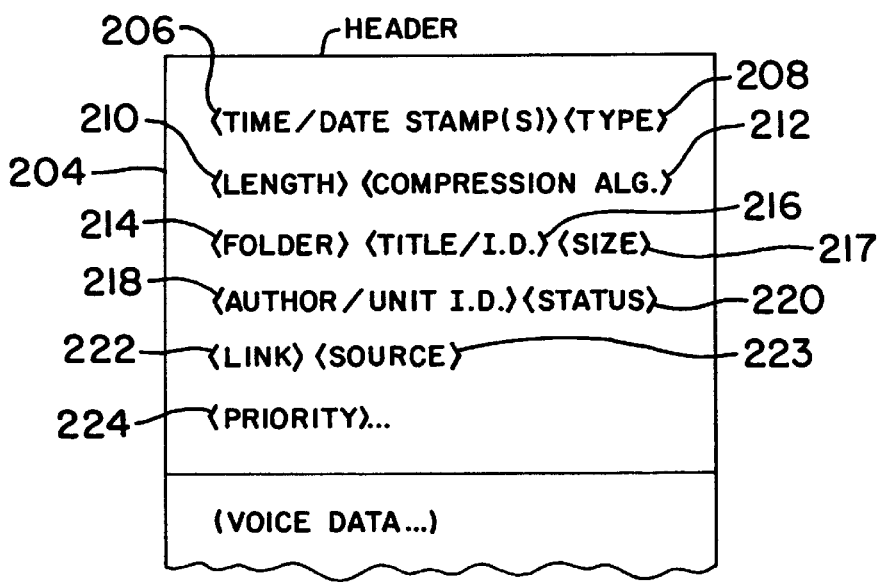
FIG. 6 illustrates a voice file format, including header data, for voice data files stored in the portable recorder.

FIG. 6 schematically illustrates a format that may be employed for each of the voice data files referred to above. Recorded with, or otherwise associated with, each voice file is header data 204, which preferably includes one or more time and date stamps 206 (corresponding to a time or times at which the voice file was originally recorded or additional voice information was added to the file); data 208 indicating the type of the file (in this case, the type being "voice"); data 210 which indicates the length (in minutes and seconds) of the corresponding voice file; data 212 which indicates the compression algorithm employed with respect to the voice file; data 214 which indicates the "folder" with which the corresponding voice file is associated; title or other identifying data 216, which indicates a title or other name used to identify the corresponding voice file; "size" data 217 which indicates the number of data words making up the voice file; data 218 which identifies the individual user who created the voice file and possibly also the particular portable recorder which was used to create the voice file; "status" data 220, which indicates, for example, whether the user has designated the file as "complete" and ready for forwarding to a transcriptionist; data 222 which may be provided to indicate links between the present voice data file and other files, including other voice data files; "source" data 223 which indicates whether the associated voice file was generated internally via the recorder microphone or downloaded from an external source, such as a voice mail system; and a "priority" flag 224, which indicates, in the case of a dictation file, whether it is to be processed on a priority basis after uploading to the PC 16 and/or transfer to central dictation system 28.

According to an alternative preferred embodiment of the invention, the user of the recorder is permitted to define up to six fields of header data which are suitable to the user's particular application. For example, if the recorder is to be used in a medical practice, the six customizable fields may correspond to such items as work type, department, procedure number, location number, medical record number, patient's date of birth. Moreover, the user may be permitted to select from among a number of different header data formats so that the header format used is one which is most appropriate to the nature or purpose of the respective voice data file.

It should be understood that the header data format shown in FIG. 6 is only an example of many possible header data formats. The order of the data may be changed, additional header data may be provided, and many of the types of data shown in FIG. 6 may be omitted. As addressed by the following discussion, it will be seen that the key elements of header data in regard to the present invention are the folder data 214, author data 218 and source data 223.

Adaptive Control Options for Handling Voice Files

According to the invention, the folder data 214 or the source data 223 may be used to determine what options are available to the user of the recorder in connection with a selected voice data file. For example, if the source data 223 indicates that the voice data file is a voice mail message that has been downloaded to the recorder, the user may be permitted only the options of playing back the voice file and appending additional voice data to the end of the voice file. However, additional options may be available to the user if the source data 223 indicates that the voice data file was one which was created directly within the recorder itself. The complete array of options available with respect to such a voice file might include adding or deleting voice data at any point in the file as well as playing back the entire file or any part of the file.

To provide an example in which the folder data 214 is used to determine which options are available to the user, it will be assumed that the recorder is arranged for use by an insurance company investigator. It is further assumed that one folder (represented by icon 126 in FIG. 5) is used to store reports created by the investigator himself or herself and another folder (represented by icon 128) is to be used exclusively for statements from witnesses recorded directly into the portable recorder 12. As to files which are, as indicated by the folder data 214, stored in the "report" folder 126, a full range of editing options would be available. As to voice files indicated by the respective folder data 214 to be stored in the "witness" folder 128 it may be provided that no editing options whatsoever are available, or that the user is permitted to add voice information only at the beginning or the end of the voice file. Preferably voice files stored in either one of the "report" and "witness" folders could be played back in their entirety or in segments.

Figure 7:
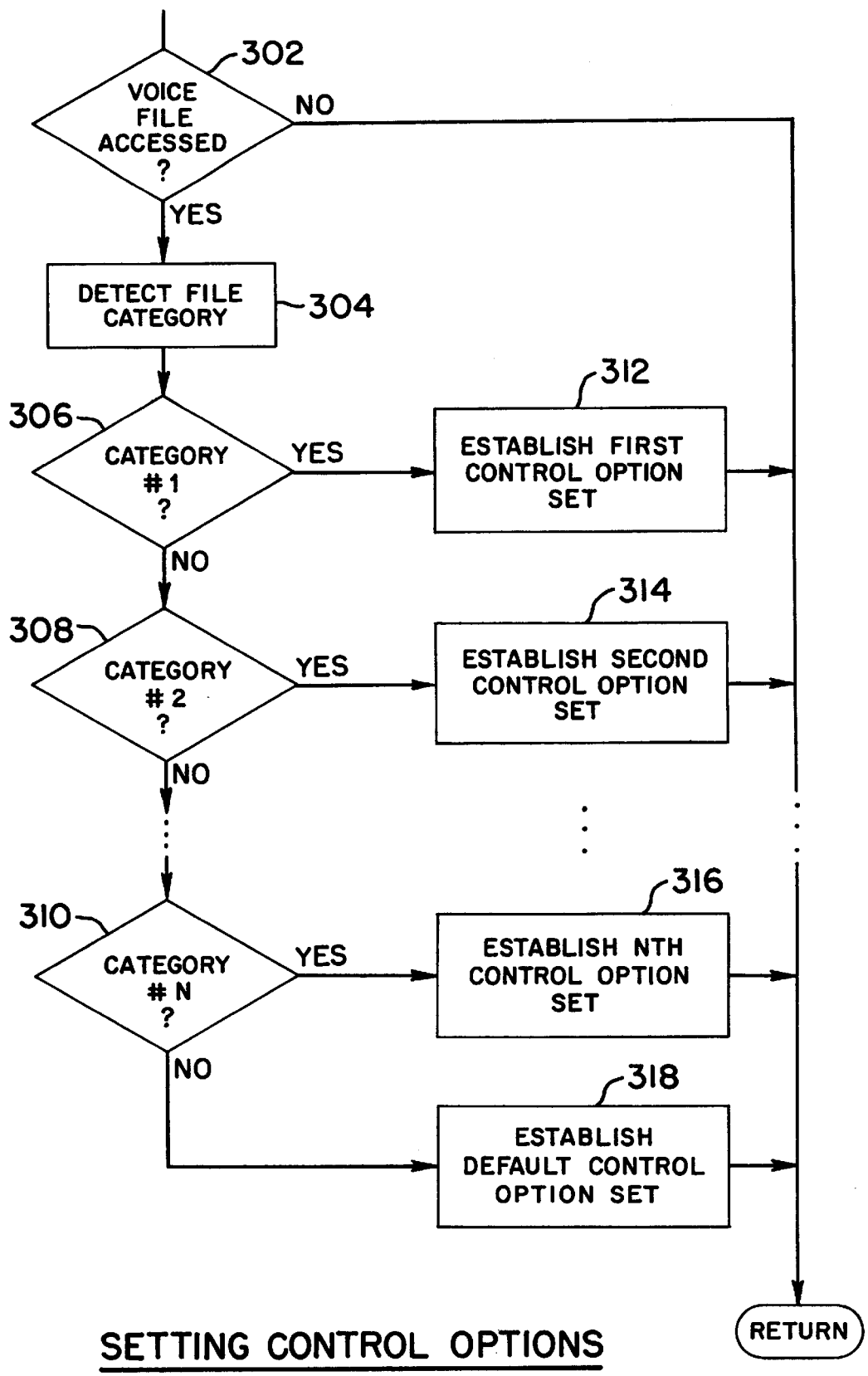
FIG. 7 is a flow chart which illustrates a software routine for setting control options in the portable recorder of FIGS. 2 and 3 in accordance with an aspect of the invention.

FIG. 7 represents a generalized procedure by which file header data is used by the recorder to determine what user options are available in regard to a selected voice file. As indicated at step 302 in FIG. 7, it is first determined whether a voice file has been accessed. Following step 302 is step 304. At step 304 it is determined what category of file is being accessed for the purpose of determining what control options are available with respect to the file. From the foregoing discussion it will be understood that the category of the file may be determined from one or more of the items of header data that have been referred to above, particularly from the folder header data (item 214, FIG. 6) and/or the source data 223 (also FIG. 6).

Steps 306, 308 and 310 in FIG. 7 respectively indicate determinations that the accessed voice file falls into a first, a second, or an "nth" category. Upon making such determinations, a first, a second, or an "nth" set of control options is made available to the user with respect to the accessed voice file (steps 312, 314, 316, respectively). If a negative determination is made at each of steps 306, 308 and 310, then a "default" set of control options is made available to the user (step 318). The following table presents a group of voice file categories and the corresponding control option sets as provided in one preferred embodiment of the invention.

| VOICE FILE CATEGORY | CONTROL OPTION SET |
| --- | --- |
| (1) Report file | (1) Full editing options, including record-append, delete, insert, record-over, playback; upload to PC |
| (2) Witness statement file | (2) Record-append; playback; upload to PC |
| (3) Dictation file | (3) Same options as (1) |
| (4) Downloaded voice mail file | (4) Playback; reply-to-sender |
| (5) Outgoing voice mail file | (5) Same as (1); plus inputting address information; upload to PC |
| — | (Default) = same as (1) |

The "record-append" option as referred to above means adding additional voice data at the end of the voice file; when no voice data is present in the file (i.e., the file is "empty"), the "end" of the file is also the beginning.

The "reply-to-sender" option referred to in connection with option set (4) provides for automatically generating an outgoing empty voice mail message file to be "filled" with voice data created by the user, and having associated with the file a destination address which matches the address of the person who originated the subject downloaded voice mail file. Preferably the address information is provided as part of the "source" header data for the subject downloaded voice mail file.

As will be recognized by those who are skilled in the art, many variations on the above-described categories/option sets scheme may be devised. For example, the option set (4) indicated above may include one or both of the above-described "record-append" option and an option to insert addition voice data only at the beginning of the file.

Adaptive User Operating Profiles

Another convenient feature provided in a preferred embodiment of the invention makes it easier to share a single recorder unit among two or more users by automatically adapting certain operating parameters of the recorder unit according to the preferences of the individual who is using the unit at a given time.

Figure 8:
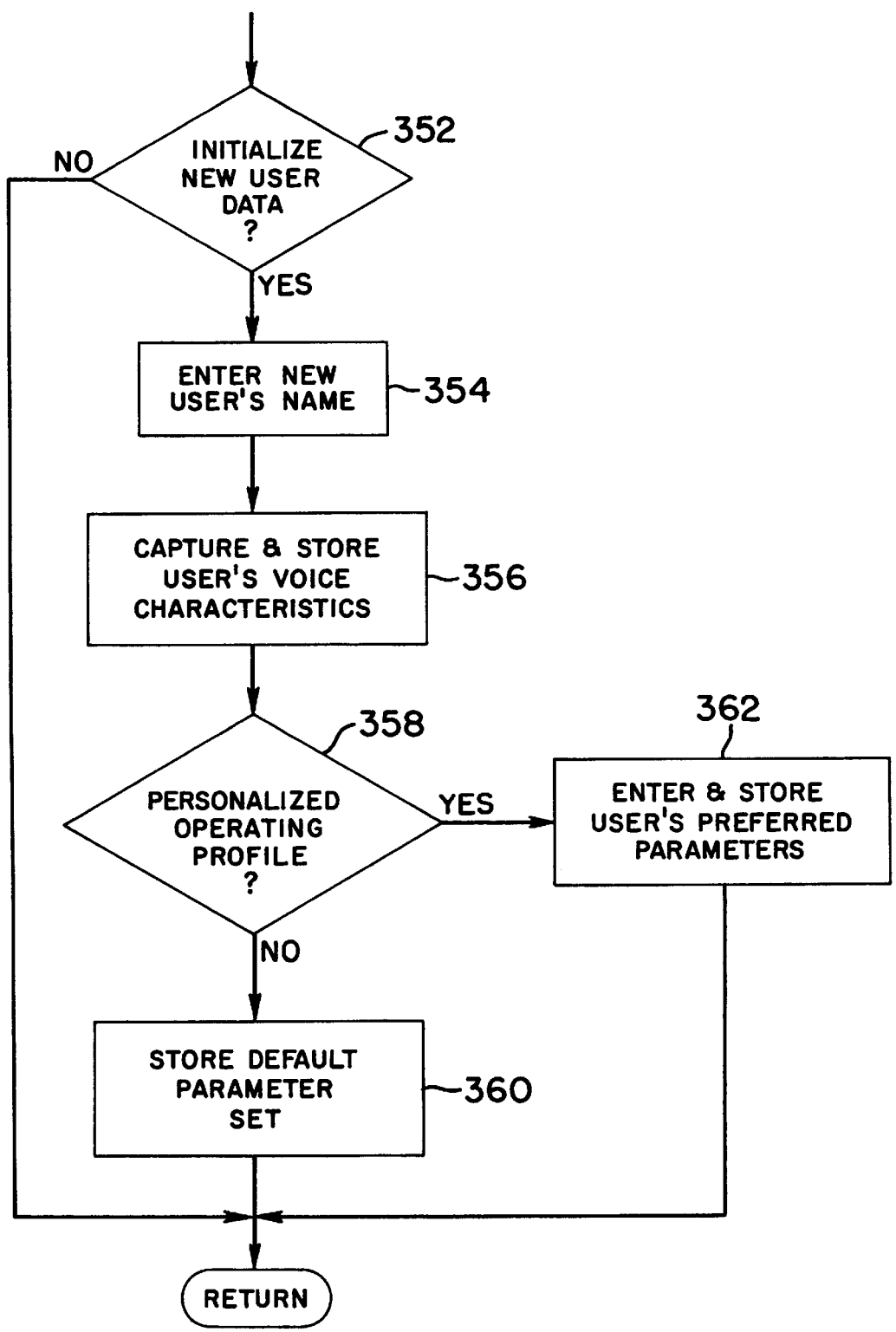
FIG. 8 is a flow chart which illustrates a set-up routine carried out in accordance with an aspect of the invention in the portable recorder.

A preferred arrangement of this feature entails a set-up procedure which is illustrated by the flow chart shown in FIG. 8. Initially in FIG. 8 is a decision block 352 at which it is determined whether the user has indicated that he or she is a new user for whom appropriate data should be stored in the recorder unit. If a positive determination is made at step 352, then step 354 follows. At step 354 the user is prompted to enter his or her name. For this purpose an alphabetic (or alpha-numeric) keypad display (not shown) is provided. After the user's name has been entered, step 356 takes place. At step 356 the user is prompted to speak into the recorder microphone one or more predetermined words or phrases. The recorder unit then stores and analyzes the spoken utterance to determine certain characteristics of the user's voice. Data indicative of the characteristics is then stored by the recorder unit.

After step 356, and as indicated by decision block 358, the recorder unit prompts the user to indicate whether he or she desires to have the recorder unit operate in accordance with a personalized operating parameter profile. If not, the recorder unit simply stores an indication that a default operating parameter set is to be employed when the recorder unit is in use by the particular user (step 360). However, if the user indicates that a personalized operating parameter profile is desired, then step 362 follows step 358. At step 362 the user is prompted to enter preferred values for one or more operating parameters. The recorder unit then stores the entered values as the user's preferred operating parameter profile. The operating parameters available for specification by the user may include one or more of the following: output volume level, playback speed, rewind increment, VOX on or off, VOX sensitivity, timing of end zone warning, compression algorithm, microphone gain level, inactivity time-out period, 12- or 24-hour time notation, backlight time-out period, VOX holdover period, automatic deletion of files after uploading to another device, options as to header data for voice files (including header data format or field definition), file search criteria (which define how files are organized and presented in response to a "FIND" command).

It is believed that the significance of each of these parameters will be familiar to, or readily understood by, those of ordinary skill in the art. Nevertheless, to aid the general reader, a brief explanation of some of these parameters follows.

By "rewind increment" is meant a time increment which corresponds to an amount by which the current file location pointer is moved in a reverse direction in response to actuation of a rewind function.

By "end zone warning" is meant an audible or other type of signal which indicates to the user that the recording medium (e.g., the removable memory 64) has no more than a predetermined recording capacity that remains unused. In connection with this parameter, it will be understood that the predetermined time increment is settable by the user.

By "inactivity time-out period" is meant the length of time after which the recorder unit enters into a sleep mode if no input (via the microphone, the touch screen or the control switches) is provided by the user during the time period.

By "backlight time-out period" is meant the length of time after which the display backlight is extinguished if no input is provided by the user.

By "VOX holdover period" is meant the length of time after a period of silence begins during which recording continues when a VOX operating mode is in effect.

FIG. 9 illustrates a process by which the recorder unit adapts the operating parameter profile to the identity of a current user. Initially in FIG. 9 is step 370, which indicates the beginning of a session of use of the recorder unit. Then, at step 372, data is entered to indicate the identity of the present user of the recorder unit. One way in which the user's identity may be entered is by the user speaking a predetermined word or phrase into the microphone of the recorder unit. The unit then captures and stores certain characteristics of the user's voice and compares these characteristics with the voice characteristic data stored pursuant to an initialization process or processes, as discussed hereinabove in connection with step 356 of FIG. 8. Alternatively, user identifying data may be entered via the touch screen.

Step 374 follows step 372. At step 374, and based on the user identification data entered or generated at step 372, the recorder unit either selects the operating parameter profile that was previously stored for the user identified at step 372, or if no such operating parameter profile has been stored, the default set of operating parameters is put into effect. The recorder use session then continues (step 376).

In connection with the set-up process illustrated in FIG. 8 it was indicated that a prospective user's voice characteristics would be captured and stored by the recorder unit. However, in addition to or instead of storing the user's voice characteristics, the user may be prompted to enter a password or security code or the like, and the entry of such password or security code may form a part or all of step 372 referred to above in connection with FIG. 9.

A preferred embodiment of the invention includes both the features of (a) adapting a set of control options according to the category of voice file that is currently accessed by the user; and (b) adapting a set of operating parameters according to the identity of the person who is currently using the recorder. However, it is contemplated to omit either feature (a) or feature (b).

Although the portable recorder shown herein includes both embedded and removable memory devices, it is contemplated to omit one or the other of the memory devices or to include additional memory.

It should be noted that the hardware and data communication environment illustrated and described in connection with FIGS. 1–3 may be changed in a number of other respects without departing from the invention. For example, among other changes which may be made in the recorder 12, the touch screen 32 may be omitted in favor of a one or two line character display (not shown). In such a case, additional switches, which may include software-programmable keys, may be added to provide aspects of the user interface. The switches may include a thumbwheel switch to be used for scrolling among menu items. The recorder may also include a key pad and/or a bar code reader. These items may be permanently installed as part of the recorder, or may be provided as one or more optional snap-on modules. The key pad and bar code reader may be employed to enter header data and for other purposes.

In addition to or instead of the cradle-based data link between the recorder 12 and the PC 16, data communication may be established between the recorder and the PC by a wireless RF link and/or infrared data communication. One type of communication that may be used is the well-known IRDA technique. Moreover, the cradle referred to above may be changed to permit serial (e.g. RS-232 or USB) data communication or IR data communication between the PC and the recorder.

It should also be understood that the data communication between the PC 16 and other components of the voice data management system 10 (FIG. 1) may be implemented by connections other than or in additional to the local area network 24 referred to above. Thus, one or more of dial-up telephone data lines, dedicated telephone data channels, a wide area network, and/or wireless data communication may be provided to interconnect system components. The constituents of the voice data management system may be more or fewer in number than those shown in FIG. 1. For example, more than one central dictation system may be connected to the PC 16.

It is to be understood that the above description may indicate to those skilled in the art additional ways in which the principles of this invention may be used without departing from the spirit of the invention. The particularly preferred methods and apparatus are thus intended in an illustrative and not limiting sense. The true spirit and scope of the invention are set forth in the following claims.

What is claimed is:

1. A method of operating a portable digital audio recorder, comprising the steps of:

storing a plurality of voice data files in said recorder, at least one of said voice data files being of a first type, and at least one of said voice data files being of a second type different from said first type;

selecting one of said stored voice data files;

determining a type of the selected voice data file;

providing a first set of control options with respect to the selected voice data file if the selected voice data file is of the first type; and if the selected data file is of the second type, providing a second set of control options with respect to the selected voice data file, said second set of control options being different from said first set of control options.

2. A method according to claim 1, wherein said first set of control options includes a record-append option whereby a user of the recorder is permitted to record voice data at an end of the selected voice data file, said record-append option not being included in said second set of control options.

3. A method according to claim 1, wherein said first type of voice data files consists of voice data files corresponding to audio signals input into the recorder via a microphone included in the recorder, and said second type of voice data files consists of voice mail messages downloaded to the recorder from a device separate from said recorder.

4. A method according to claim 3, wherein said first set of control options includes an upload option whereby a user of the recorder is permitted to upload the selected voice data file to a device separate from the recorder, said upload option not being included in said second set of control options.

5. A method according to claim 3, wherein said second set of control options includes a reply option whereby a user of the recorder is permitted to generate a voice message reply to the selected voice data file, said recorder automatically generating address data for said voice message reply, said addressee data corresponding to sender data for the selected voice data file, said reply option not being included in said first set of control options.

6. A method according to claim 1, wherein said first set of control options includes options for editing the selected voice data file, and said second set of control options does not include said options for editing the selected voice data file.

7. A portable digital audio recorder, comprising:

a microphone for converting voice sounds spoken by a user of the recorder into analog electrical signals;

means for converting the analog electrical signals into digital voice signals;

a recording medium for storing the digital voice signals in the form of a plurality of voice data files, at least one of said voice data files being of a first type, and at least one of said voice data files being of a second type different from said first type;

means for selecting one of said stored voice data files;

means for determining a type of the selected voice data file; and control means for providing a first set of control options with respect to the selected voice data file if the selected voice data file is of the first type, and for providing a second set of control options with respect to the selected voice data file if the selected voice data file is of the second type, said second set of control options being different from said first set of control options.

8. A portable digital audio recorder according to claim 7, wherein said first set of control options includes a record-append option whereby a user of the recorder is permitted to record voice data at an end of the selected voice data file, said record-append option not being included in said second set of control options.

9. A portable digital audio recorder according to claim 7, wherein said first type of voice data files consists of voice data files corresponding to audio signals input into the recorder via said microphone, and said second type of voice data files consists of voice mail messages downloaded to the recorder from a device separate from said recorder.

10. A portable digital audio recorder according to claim 9, wherein said first set of control options includes an upload option whereby a user of the recorder is permitted to upload the selected voice data file to a device separate from the recorder, said upload option not being included in said second set of control options.

11. A portable digital audio recorder according to claim 9, wherein said second set of control options includes a reply option whereby a user of the recorder is permitted to generate a voice message reply to the selected voice data file, said recorder automatically generating address data for said voice message reply, said addressee data corresponding to sender data for the selected voice data file, said reply option not being included in said first set of control options.

12. A portable digital audio recorder according to claim 7, wherein said first set of control options includes options for editing the selected voice data file, and said second set of control options does not include said options for editing the selected voice data file.

13. A portable digital audio recorder, comprising:

a microphone for converting voice sounds spoken by a user of the recorder into analog electrical signals;

means for converting the analog electrical signals into digital voice signals;

a recording medium for storing the digital voice signals;

means for generating identification data which identifies the user of the recorder; and means for setting operating parameters for the recorder on the basis of the identification data.

14. A portable digital audio recorder according to claim 13, wherein said means for generating includes means for detecting characteristics of the user's voice.

15. A portable digital audio recorder according to claim 13, wherein said operating parameters set by said means for setting include at least one of output volume level, playback speed, rewind increment, VOX sensitivity; and timing of end zone warning.

16. A portable digital recorder according to claim 13, wherein said recording medium is a solid state memory card.

17. A method of operating a portable digital audio recorder, comprising the steps of:

storing a plurality of sets of operating parameters for said portable digital audio recorder;

generating identification data which identifies a current user of the recorder;

selecting one of the stored sets of operating parameters on the basis of said identification data; and operating the recorder in accordance with the selected set of operating parameters.

18. A method according to claim 17, wherein said set of operating parameters includes at least one of output volume level, playback speed, rewind increment, VOX sensitivity, and timing of end zone warning.

19. A method according to claim 17, wherein said generating step includes receiving voice sounds spoken by the current user and analyzing the voice sounds to detect the identity of the current user.

* * * * *